(12) United States Patent
Palacios-Laloy (10) Patent No.: US 9,587,303 B2
(45) Date of Patent: Mar. 7, 2017

(54) METHOD FOR OBTAINING A SUBSTRATE PROVIDED WITH A COATING COMPRISING A DISCONTINUOUS THIN METAL LAYER

(71) Applicant: SAINT-GOBAIN GLASS FRANCE, Courbevoie (FR)

(72) Inventor: Augustin Palacios-Laloy, Saint Egrève (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/913,110

(22) PCT Filed: Jul. 31, 2014

(86) PCT No.: PCT/FR2014/051999
§ 371 (c)(1),
(2) Date: Feb. 19, 2016

(87) PCT Pub. No.: WO2015/025093
PCT Pub. Date: Feb. 26, 2015

(65) Prior Publication Data
US 2016/0201189 A1 Jul. 14, 2016

(30) Foreign Application Priority Data
Aug. 20, 2013 (FR) ...................................... 13 58063

(51) Int. Cl.
| C23C 14/02 | (2006.01) |
| C23C 14/06 | (2006.01) |
| C23C 14/08 | (2006.01) |
| C23C 14/58 | (2006.01) |
| C03C 17/36 | (2006.01) |
| G02B 1/12 | (2006.01) |
| C23C 14/34 | (2006.01) |
| G02B 1/08 | (2006.01) |
| H01L 31/0224 | (2006.01) |
| C23C 14/18 | (2006.01) |
| C23C 14/20 | (2006.01) |
| C23C 28/00 | (2006.01) |
| H01L 31/02 | (2006.01) |

(52) U.S. Cl.
CPC ............ C23C 14/024 (2013.01); C03C 17/36 (2013.01); C03C 17/3602 (2013.01); C03C 17/3626 (2013.01); C03C 17/3644 (2013.01); C03C 17/3649 (2013.01); C03C 17/3657 (2013.01); C03C 17/3678 (2013.01); C23C 14/0641 (2013.01); C23C 14/08 (2013.01); C23C 14/185 (2013.01); C23C 14/205 (2013.01); C23C 14/34 (2013.01); C23C 14/584 (2013.01); C23C 14/5813 (2013.01); C23C 28/322 (2013.01); C23C 28/345 (2013.01); G02B 1/08 (2013.01); G02B 1/12 (2013.01); H01L 31/022425 (2013.01); C03C 2217/425 (2013.01); C03C 2217/45 (2013.01)

(58) Field of Classification Search
CPC ... C03C 2217/45; C23C 14/024; C23C 14/08; C23C 14/185; C23C 14/205; C23C 14/34; C23C 14/5813; C23C 14/584; C23C 28/322; C23C 28/345; G02B 1/08; G02B 1/12; H01L 31/022425
See application file for complete search history.

(56) References Cited

U.S. PATENT DOCUMENTS

| 5,935,702 A | 8/1999 | Macquart et al. |
| 2010/0071810 A1 | 3/2010 | Nadaud et al. |
| 2011/0311732 A1 | 12/2011 | Bignon et al. |
| 2012/0087005 A1 | 4/2012 | Reymond et al. |
| 2013/0136894 A1* | 5/2013 | Baker ..................... B32B 33/00 428/141 |

(Continued)

FOREIGN PATENT DOCUMENTS

| JP | H08-238710 A | 9/1996 |
| JP | 2006-110807 A | 4/2006 |

(Continued)

OTHER PUBLICATIONS

International Preliminary Report on Patentability and the Written Opinion of the International Searching Authority as issued in International Patent Application No. PCT/FR2014/051999, dated Feb. 23, 2016.

(Continued)

*Primary Examiner* — Dah-Wei D Yuan
*Assistant Examiner* — Jose Hernandez-Diaz
(74) *Attorney, Agent, or Firm* — Pillsbury Winthrop Shaw Pittman LLP (57) ABSTRACT

A process for obtaining a material includes a substrate coated on at least one portion of at least one of its faces with a coating including at least one discontinuous metallic thin layer based on silver, on gold, or on any alloy thereof, the or each discontinuous metallic thin layer being encapsulated between at least two dielectric thin layers, and the or each discontinuous metallic thin layer being in the form of periodic geometric patterns, the process including a deposition step then a step wherein the substrate thus coated is made to run opposite at least one laser device emitting a laser radiation focused on the coating in the form of at least one line, the power of the radiation being adapted in order to render the or each metallic thin layer discontinuous by dewetting.

17 Claims, 2 Drawing Sheets

(56) References Cited

U.S. PATENT DOCUMENTS

2013/0183492 A1* 7/2013 Lee .................. B05D 3/068
428/148

FOREIGN PATENT DOCUMENTS

| JP | 2010-514666 A | 5/2010 |
|----|---------------|--------|
| JP | 2012-520229 A | 9/2012 |
| KR | 10-2012-0037386 A | 4/2012 |

OTHER PUBLICATIONS

International Search Report as issued in International Patent Application No. PCT/FR2014/051999, dated Jan. 21, 2015.
Riedel, S., et al., "Nanostructuring of thin films by ns pulsed laser interface," Applied Physics A, Materials Science & Processing, vol. 101, No. 2, 2010, pp. 309-312.
Fang, Y., et al., "Characterization of nanoscale clusters fabricated by pulsed laser irradiation of thin Au films," Applied Surface Science, vol. 273, 2013, pp. 625-631.
Kaganovskii, Y., et al., "Fabrication of periodic structures in thin metal films by pulsed laser irradiation," Journal of Nanophotonics, vol. 1, No. 1, Dec. 27, 2007, pp. 1-3
Yadavali, S., et al., "Pulsed laser dewetting of Au films: Experiments and modeling of nanoscale behavior," Journal of Materials Research, vol. 28, No. 13, May 2013, pp. 1715-1723.
Office Action as issued in Japanese Patent Application No. 2016-525098, dated Aug. 9, 2016.

* cited by examiner

METHOD FOR OBTAINING A SUBSTRATE PROVIDED WITH A COATING COMPRISING A DISCONTINUOUS THIN METAL LAYER

CROSS-REFERENCE TO RELATED APPLICATIONS

This application is the U.S. National Stage of PCT/FR2014/051999, filed Jul. 31, 2014, which in turn claims priority to French patent application number 1358063 filed Aug. 20, 2013. The content of these applications are incorporated herein by reference in their entireties.

The invention relates to the field of materials comprising a substrate coated with at least one nanoscale- or microscale-textured coating.

These textured coatings, which are in the form of geometric patterns, possess multiple applications, in a large number of fields. Coatings that are in the form of periodically distributed separated lines in particular find applications in the optics, electronics or else optoelectronics fields, for example as polarizers or electrodes.

Such coatings are customarily obtained by techniques such as photolithography or nanoimprint lithography. Besides their high cost, these techniques do not make it possible to treat large-sized substrates, for example of several square meters.

There is a need to be able to texture coatings much more economically. Being able to texture large-sized coatings would also make it possible to broaden the fields of application of these materials, for example to the building field.

For this purpose, a first subject of the invention is a process for obtaining a material comprising a substrate coated on at least one portion of at least one of its faces with a coating comprising at least one discontinuous metallic thin layer based on silver, on gold, or on any alloy thereof, the or each discontinuous metallic thin layer being encapsulated between at least two dielectric thin layers, and the or each discontinuous metallic thin layer being in the form of periodic geometric patterns. This process comprises the following steps:

deposited on at least one portion of at least one face of a substrate is a coating comprising at least one continuous metallic thin layer based on silver, on gold, or on any alloy thereof, then the substrate thus coated is made to run opposite at least one laser device emitting a laser radiation focused on said coating in the form of at least one line, the power of said radiation being adapted in order to render the or each metallic thin layer discontinuous by dewetting.

Another subject of the invention is a material capable of being obtained by the process according to the invention, comprising a substrate coated on at least one portion of at least one of its faces with a coating comprising at least one discontinuous metallic thin layer based on silver, on gold, or on any alloy thereof, the or each discontinuous metallic thin layer being encapsulated between at least two dielectric thin layers, and the or each discontinuous metallic thin layer being in the form of periodic geometric patterns.

This method of obtaining textured coatings with periodic geometric patterns is much more economical and faster than the known techniques, especially those based on lithography, since in its simplest form it comprises a step of depositing the coating, followed by a treatment step in which the coating runs under a laser line. These two steps may also be carried out on large-sized substrates.

The inventors have been able to demonstrate that the laser treatment, starting from a certain power, led to the dewetting of the metallic layer which, continuous to begin with, becomes discontinuous so as to form patterns. Without the scientific reason being known per se, the dewetting produced under such conditions gives rise to the formation of nanoscale or microscale periodic patterns.

The term "discontinuous" is understood to mean that the (or each) metallic thin layer covers only one portion of the subjacent layer. After dewetting, therefore in the final material, the (or each) metallic thin layer preferably covers from 30% to 60%, typically of the order of 50%, of the surface of the subjacent layer.

The expression "the or each discontinuous metallic thin layer being encapsulated between at least two dielectric thin layers" is understood to mean that dielectric layers are positioned around the or each thin layer: at least one underneath (closer to the substrate) and at least one on top (further from the substrate). The dielectric thin layers are not however necessarily in contact with the metallic layer that they surround, as explained in greater detail in the remainder of the text.

Preferably, the substrate is coated over the whole of one of its faces. The coating, whether it is intermediate (before laser treatment) or final (after laser treatment) advantageously comprises a single metallic thin layer, in particular based on, or even consisting of, silver.

The (or where appropriate each) metallic thin layer preferably essentially consists of, or consists of, silver, gold or any alloy thereof. Preferably, the (or each) metallic thin layer consists of silver. Silver may be deposited easily, in particular by sputtering, and has advantageous optical and electrical properties, in particular electrical conductivity properties, low emissivity properties and reflection properties in the infrared range. Gold also has advantageous properties, but for a much higher cost.

The periodic geometric patterns preferably have a period within a range extending from 0.1 to 10 micrometers, in particular from 0.3 to 5 micrometers, and even from 0.4 to micrometers. These patterns, which are repeated on the scale of around a hundred nanometers or of a micrometer, have particularly advantageous properties as explained in detail in the remainder of the text.

The period of the geometric patterns may be regulated using various parameters, in particular:

the wavelength of the laser radiation; typically, when the laser line is perpendicular to the run direction, the period is of the order of double the wavelength of the laser radiation.

the angle between the laser line and the run direction. Indeed, the period is substantially proportional to the sine of this angle.

the thicknesses and refractive indices of the layers of the coating, which control the interference phenomena of the laser radiation.

the chemical nature and the thickness of the subjacent layer, located under the metallic layer, in direct contact therewith; specifically, this layer influences the wetting properties of the silver.

In one particularly advantageous embodiment, the geometric patterns obtained are lines extending in the run direction of the substrate. The geometric patterns of the final material are therefore lines. Starting from a certain power of the laser radiation, the dewetting of the (or each) metallic thin layer indeed begins to spontaneously create lines of metal (in particular of silver) in the run direction of the substrate. As indicated above, the period of these lines is of the order of double the wavelength of the laser radiation, multiplied by the sine of the angle formed by the laser line and the run direction.

Preferably, the width of the lines is of the order of the half-period, or is even equal to the half-period. This width is advantageously within a range extending from 0.05 to 5 micrometers, in particular from 0.15 to 2.5 micrometers, and even from 0.2 to 2 micrometers. The zone occupied by these lines preferably represents from 40% to 60%, typically of the order of 50%, of the surface of the subjacent layer. Thus, the width of the zones not coated with the (or each) metallic thin layer is preferably within a range extending from 0.05 to 5 micrometers, in particular from 0.15 to 2.5 micrometers, and even from 0.2 to 2 micrometers. In light polarization applications, the choice of the period is important since it makes it possible to polarize radiation of which the wavelength is of the order of this period.

According to another preferred embodiment, the periodic patterns have a periodicity along at least two axes that are not parallel to one another. The periodic patterns may in particular be drops of substantially identical sizes and shapes that are regularly spaced and are periodically ordered along several axes that are not parallel to one another. The drops may in particular be ordered so that each drop is the center of a hexagon, in particular a regular hexagon, the vertices of which are the six drops closest to the drop in question. The drops may have a substantially elliptical or circular shape. Indeed, it has turned out that by increasing the power of the laser radiation to levels above those that create the linear patterns (or, as will be seen further on, by decreasing the run speed), the lines previously formed themselves began to be dewetted in order to form such drops. In an intermediate stage (therefore for an intermediate power or run speed), the patterns are then in the form of lines, the width of which varies periodically. Specifically, the drops are not yet separated.

The physical thickness of the or each continuous metallic (in particular silver) thin layer is preferably within a range extending from 2 to 20 nm.

The coating (before or after treatment) preferably comprises, starting from the substrate, a first coating comprising at least a first dielectric layer, at least a metallic (in particular silver) thin layer, optionally an overblocker layer and a second coating comprising at least a second dielectric layer. Thus, the metallic thin layer is itself encapsulated between at least two dielectric layers.

The overblocker layer is intended to protect the metallic layer during the deposition of a subsequent layer (for example if the latter is deposited in an oxidizing or nitriding atmosphere) and during an optional heat treatment of tempering or bending type.

The metallic layer may also be deposited on and in contact with an underblocker layer. The multilayer stack may therefore comprise an overblocker layer and/or an underblocker layer flanking the or each metallic layer.

Blocker (underblocker and/or overblocker) layers are generally based on a metal selected from nickel, chromium, titanium, niobium or an alloy of these various metals. Mention may in particular be made of nickel-titanium alloys (especially those containing about 50% of each metal by weight) or nickel-chromium alloys (especially those containing 80% nickel by weight and 20% chromium by weight). The overblocker layer may also consist of several superposed layers; for example, on moving away from the substrate, a titanium layer and then a nickel alloy (especially a nickel-chromium alloy) layer, or vice versa. The various metals or alloys cited may also be partially oxidized, and may especially be substoichiometric in oxygen (for example $TiO_x$ or $NiCrO_x$).

These blocker (underblocker and/or overblocker) layers are very thin, normally having a thickness of less than 1 nm, so as not to affect the light transmission of the multilayer stack, and can be partially oxidized during the laser treatment. In general, the blocker layers are sacrificial layers capable of capturing oxygen coming from the atmosphere or from the substrate, thus preventing the metallic layer from oxidizing. It is therefore possible that, in the final product, the blocker layers are at least partially oxidized.

The first and/or the second dielectric layer is preferably an oxide (especially tin oxide or titanium oxide), or a nitride, especially silicon nitride (in particular in the case of the second dielectric layer, the one furthest away from the substrate). In general, the silicon nitride may be doped, for example with aluminum or boron, so as to make it easier to deposit it by sputtering techniques. The degree of doping (corresponding to the atomic percentage relative to the amount of silicon) generally does not exceed 2%. The function of these dielectric layers is to protect the metallic layer from chemical or mechanical attack and they also influence the optical properties, especially in reflection, of the multilayer stack, through interference phenomena.

The first coating may comprise one dielectric layer or several, typically 2 to 4, dielectric layers. The second coating may comprise one dielectric layer or several, typically 2 to 3, dielectric layers. These dielectric layers are preferably made of a material selected from silicon nitride, titanium oxide, tin oxide and zinc oxide, or any of their mixtures or solid solutions, for example a tin zinc oxide, or a titanium zinc oxide. The physical thickness of the dielectric layer, or the overall physical thickness of all the dielectric layers, whether in the first coating or in the second coating, is preferably between 5 and 200 nm, especially between 10 and 100 nm, or between 20 and 50 nm.

The first coating preferably comprises, immediately beneath the metallic (in particular silver) layer or beneath the optional underblocker layer, a wetting layer, the function of which is to increase the wetting and bonding of the metallic (in particular silver) layer. Zinc oxide, especially when doped with aluminum, has proven to be particularly advantageous in this regard.

The first coating may also contain, directly beneath the wetting layer, a smoothing layer, which is a partially or completely amorphous mixed oxide (and therefore one having a very low roughness), the function of which is to promote growth of the wetting layer in a preferential crystallographic orientation, thereby promoting silver crystallization through epitaxial phenomena. The smoothing layer is preferably composed of a mixed oxide of at least two metals selected from Sn, Zn, In, Ga and Sb. A preferred oxide is antimony-doped indium tin oxide.

In the first coating, the wetting layer or the optional smoothing layer is preferably deposited directly on the first dielectric layer. The first dielectric layer is preferably deposited directly on the substrate. For optimally adapting the optical properties (especially the appearance in reflection) of the multilayer stack, the first dielectric layer may as an alternative be deposited on another oxide or nitride layer, for example a titanium oxide layer.

Within the second coating, the second dielectric layer may be deposited directly on the metallic (in particular silver) layer or preferably on an overblocker, or else on other oxide or nitride layers intended for adapting the optical properties of the multilayer stack. For example, a zinc oxide layer, especially one doped with aluminum, or a tin oxide layer, may be placed between an overblocker and the second dielectric layer, which is preferably made of silicon nitride. Zinc oxide, especially aluminum-doped zinc oxide, helps to improve the adhesion between the metal (in particular silver) and the upper layers.

Thus, the coating (before or after treatment) preferably comprises at least one ZnO/Ag/ZnO succession. The zinc oxide may be doped with aluminum. An underblocker layer may be placed between the silver layer and the subjacent layer. Alternatively or additionally, an overblocker layer may be placed between the silver layer and the superjacent layer.

Finally, the second coating may be surmounted by an overlayer, sometimes referred to as an "overcoat" in the art. This last layer of the multilayer stack, which is therefore the one in contact with the ambient air, is intended to protect the multilayer stack from any mechanical attack (scratches, etc.) or chemical attack. This overcoat is generally very thin so as not to disturb the appearance in reflection of the multilayer stack (its thickness is typically between 1 and 5 nm). It is preferably based on titanium oxide or a mixed tin zinc oxide, especially one doped with antimony, deposited in substoichiometric form.

The multilayer stack may comprise one or more metallic (in particular silver) layers, especially two or three silver layers. When several metallic (in particular silver) layers are present, the general architecture presented above may be repeated. In this case, the second coating relative to a given metallic (in particular silver) layer (and therefore located above this metallic layer) generally coincides with the first coating relative to the next metallic layer.

The thin layers based on titanium oxide have the distinctive feature of being self-cleaning, by facilitating the degradation of organic compounds under the action of ultraviolet radiation and the removal of mineral soiling (dust) under the action of water runoff. Their physical thickness is preferably between 2 and 50 nm, in particular between 5 and 20 nm, limits included.

The architecture of the coating described above is valid as much for the coating before laser treatment as after said laser treatment. Indeed, the dewetting of the metallic layer does not modify the order of the layers. However, the dewetting of the metallic layer modifies the thickness of the coating, which becomes irregular: thicker in the zones coated with the metal, less thick in the uncoated zones. In the latter zones, the dewetting of the metal also has the effect of bringing the layers previously separated by the metallic layer, for example the wetting layer and the overblocker layer, into contact.

According to the invention, at least one laser device emits a laser radiation focused on said coating in the form of at least one line. The or each line will be referred to as a "laser line" in the remainder of the text.

Lasers generally consist of modules comprising one or more laser sources and also forming and redirecting optics.

The laser sources are typically laser diodes or fiber or disk lasers. Laser diodes make it possible to economically achieve high power densities with respect to the electrical supply power for a small space requirement. The space requirement of fiber lasers is even smaller, and the linear power density obtained may be even higher, for a cost that is however greater.

The radiation resulting from the laser sources may be continuous or pulsed, preferably continuous. When the radiation is pulsed, the repetition frequency is advantageously at least 10 kHz, in particular 15 kHz and even 20 kHz so as to be compatible with the high run speeds used.

The wavelength of the laser radiation is preferably within a range extending from 200 to 2000 nm, in particular from 500 to 1500 nm. High-power laser diodes that emit at at least a wavelength selected from 808 nm, 880 nm, 915 nm, 940 nm or 980 nm have proved particularly suitable, silver and gold absorbing this type of radiation satisfactorily.

The forming and redirecting optics preferably comprise lenses and mirrors, and are used as means for positioning, homogenizing and focusing the radiation.

The purpose of the positioning means is, where appropriate, to arrange the radiation emitted by the laser sources along a line. They preferably comprise mirrors. The purpose of the homogenization means is to superpose the spatial profiles of the laser sources in order to obtain a homogeneous linear power density along the whole of the line. The homogenization means preferably comprise lenses that enable the separation of the incident beams into secondary beams and the recombination of said secondary beams into a homogeneous line. The radiation-focusing means make it possible to focus the radiation on the coating to be treated, in the form of a line of desired length and width. The focusing means preferably comprise a convergent lens.

The or each line possesses a length and a width. The term "length" of the line is understood to mean the largest dimension of the line, measured on the surface of the coating, and the term "width" is understood to mean the dimension in a direction transverse to the direction of the largest dimension. As is customary in the field of lasers, the width w of the line corresponds to the distance (along this transverse direction) between the axis of the beam (where the intensity of the radiation is at a maximum) and the point where the intensity of the radiation is equal to $1/e^2$ times the maximum intensity. If the longitudinal axis of the laser line is referred to as x, it is possible to define a width distribution along this axis, referred to as w(x).

The mean width of the or each laser line is preferably at least 35 micrometers, in particular within a range extending from 40 to 100 micrometers or from 40 to 70 micrometers. Throughout the present text the term "mean" is understood to mean the arithmetic mean. Over the entire length of the line, the width distribution is narrow in order to avoid any treatment heterogeneity. Thus, the difference between the largest width and the smallest width is preferably at most 10% of the value of the mean width. This number is preferably at most 5% and even 3%.

The length of the or each laser line is preferably at least 10 cm or 20 cm, in particular within a range extending from 30 to 100 cm, in particular from 30 to 75 cm, or even from 30 to 60 cm. For example, it is possible to use, for a substrate having a width of 3.3 m, 11 lines having a length of 30 cm.

The forming and redirecting optics, in particular the positioning means, may be adjusted manually or with the aid of actuators that make it possible to adjust their positioning remotely. These actuators (typically piezoelectric motors or blocks) may be controlled manually and/or be adjusted automatically. In the latter case, the actuators will preferably be connected to detectors and also to a feedback loop.

At least part of the laser modules, or even all of them, is preferably arranged in a leaktight box, which is advantageously cooled, and especially ventilated, so as to ensure their heat stability.

The laser modules are preferably mounted on a rigid structure referred to as a "bridge", based on metallic elements, typically made of aluminum. The structure preferably does not comprise a marble slab. The bridge is preferably positioned parallel to the conveying means so that the focal plane of the or each laser line remains parallel to the surface of the substrate to be treated. Preferably, the bridge comprises at least four feet, the height of which can be individually adjusted in order to ensure a parallel positioning in all circumstances. The adjustment may be provided by motors located at each foot, either manually or automatically, in connection with a distance sensor. The height of the bridge may be adapted (manually or automatically), in order to take into account the thickness of the substrate to be treated, and to thus ensure that the plane of the substrate coincides with the focal plane of the or each laser line.

The dewetting of the or each metallic thin layer may be obtained by acting on the linear power density of the laser and/or the run speed of the substrate. At constant linear power density, the dewetting will be obtained for run speeds below a threshold value. Conversely, at constant run speed, the dewetting will be obtained for linear power densities above a threshold value.

For a given coating (and in particular a given absorption), the dewetting will be obtained starting from a certain value of the ratio between the linear power density (where appropriate divided by the square root of the duty cycle) and the square root of the run speed.

These threshold values depend on several factors: the nature of this metallic layer, its thickness, the type of layers of the multilayer stack and their thicknesses. The appropriate power or run speed may easily be determined for a given coating, by gradually increasing the power of the laser or by decreasing the run speed until the appearance of geometric patterns is observed. Below the minimum power or above the maximum speed for obtaining the dewetting, the metallic layer remains continuous, and the treatment has above all the effect of improving the crystallization of the metallic layer and its electronic and low-emissivity properties.

In particular for multilayer stacks comprising a single silver layer having a physical thickness of the order of 10 nm, the ratio between the linear power density and the square root of the runs speed is advantageously at least 13 or 14, in particular between 14 and 15 $W \cdot min^{1/2} \cdot cm^{-3/2}$.

The linear power density divided by the square root of the duty cycle of the laser sources is preferably at least 300 W/cm, advantageously 350 or 400 W/cm, in particular 450 W/cm, or 500 W/cm and even 550 W/cm. The linear power density divided by the square root of the duty cycle is even advantageously at least 600 W/cm, in particular 800 W/cm, or even 1000 W/cm. When the laser radiation is continuous, the duty cycle is equal to 1, so that this number corresponds to the linear power density. The linear power density is measured at the place where the or each laser line is focused on the coating. It may be measured by placing a power detector along the line, for example a calorimetric power meter, such as in particular the Beam Finder power meter from the company Coherent Inc. The power is advantageously distributed homogeneously over the entire length of the or each line. Preferably, the difference between the highest power and the lowest power is equal to less than 10% of the mean power.

The energy density provided to the coating divided by the square root of the duty cycle is preferably at least 20 $J/cm^2$, or even 30 $J/cm^2$. Here too, the duty cycle is equal to 1 when the laser radiation is continuous.

The run speed of the substrate is advantageously at least 4 m/min, in particular 5 m/min and even 6 m/min or 7 m/min, or else 8 m/min and even 9 m/min or 10 m/min. According to certain embodiments, the run speed of the substrate may be at least 12 m/min or 15 m/min, in particular 20 m/min and even 25 or 30 m/min. As indicated above, the run speeds that make it possible to obtain the dewetting of the metallic layer depend on the multilayer stack, but may easily be determined. In order to ensure a treatment that is as homogeneous as possible, the run speed of the substrate varies during the treatment by at most 10% in relative terms, in particular 2% and even 1% with respect to its nominal value.

In order to improve the effectiveness of the treatment, it is preferable for at least one portion of the (main) laser radiation transmitted through the substrate and/or reflected by the coating to be redirected in the direction of said substrate in order to form at least one secondary laser radiation, which preferably impacts the substrate at the same location as the main laser radiation, advantageously with the same focus depth and the same profile. The formation of the or each secondary laser radiation advantageously uses an optical assembly comprising only optical elements selected from mirrors, prisms and lenses, in particular an optical assembly consisting of two mirrors and a lens, or of a prism and a lens. By recovering at least one portion of the main radiation lost and by redirecting it toward the substrate, the heat treatment is considerably improved thereby. The choice of using the portion of the main radiation transmitted through the substrate ("transmission" mode) or the portion of the main radiation reflected by the coating ("reflection" mode), or optionally of using both, depends on the nature of the coating and on the wavelength of the laser radiation.

The temperature to which the coating is subjected during the heat treatment is preferably at least 500° C., in particular 600° C., or 700° C. The dewetting is not normally accompanied by melting of the metal, but is due to a thermally activated increase in the mobility of the atoms.

Preferably, the temperature of the substrate on the side opposite the coated side does not exceed 100° C., in particular 50° C. and even 30° C. during the heat treatment.

The number of laser lines may be at least 3, or 4, or even 5, or else 6, or 7, or 8, and even 9, or else 10 or 11, as a function of the width of the substrates to be treated. The number of laser lines is preferably between 3 and 11 (limits included), in particular between 5 and 10 (limits included).

It is preferable for the laser lines to be positioned so that the entire surface of the multilayer stack can be treated. Several arrangements can be envisaged depending on the size of the laser lines.

The or each laser line is preferably positioned perpendicular to the run direction of the substrate, or positioned obliquely. The laser lines are preferably parallel to one another. The various laser lines may treat the substrate simultaneously or in a delayed manner. By way of example, the laser lines may be positioned in a V shape, in staggered rows or else at an angle.

The laser lines may be arranged in rows perpendicular to the run direction of the substrate. The number of rows is, for example, at least 2, or even 3. Advantageously, the number of rows is no greater than 3 in order to limit the floor area of the laser treatment zone.

In order to ensure that the substrate is affected by the treatment in its entirety, it is preferable to position the laser lines so that there is an overlap, that is to say that certain regions (of small size, typically of less than 10 cm, or 1 cm) are treated at least twice.

In the run direction of the substrate, the distance between two laser lines treating adjacent regions is preferably such that the regions of overlap have time to return to a temperature close to ambient temperature in order to avoid damaging the coating. Typically, the distance between two laser lines treating adjacent regions is advantageously at least three times the distance traveled by one point of the layer under the laser line.

Alternatively, the laser lines may be positioned on one and the same line (in other words the number of rows is 1). In this case, it is preferable to choose a profile that makes it possible to obtain a continuous and homogeneous laser line at the coating.

The substrate may be moved using any mechanical conveying means, for example using belts, rollers or trays moving translationally. The conveying system makes it possible to control and regulate the run speed. The conveying means preferably comprises a rigid chassis and a plurality of rollers. The pitch of the rollers is advantageously within a range extending from 50 to 300 mm. The rollers probably comprise metal rings, typically made of steel, covered with plastic wrappings. The rollers are preferably mounted on bearings with reduced clearance, typically in a proportion of three rollers per bearing. In order to ensure perfect flatness of the conveying plane, the positioning of each of the rollers is advantageously adjustable. The rollers are preferably moved using pinions or chains, preferably tangential chains, driven by at least one motor.

If the substrate is made of a flexible polymeric organic material, it may be moved using a film advance system in the form of a succession of rollers. In this case, the flatness may be ensured by an appropriate choice of the distance between the rollers, taking into account the thickness of the substrate (and therefore its flexibility) and the impact that the heat treatment may have on the creation of a possible sag.

Of course, all relative positions of the substrate and the laser lines are possible provided that the surface of the substrate can be suitably irradiated. More generally, the substrate will be placed horizontally or substantially horizontally, but it may also be placed vertically, or at any possible inclination. When the substrate is placed horizontally, the laser lines are generally placed so as to treat the top side of the substrate. The laser lines may also treat the underside of the substrate. In this case, it is necessary for the substrate conveying system to allow the heat to pass into the zone to be treated. This is the case for example when conveying rollers are used: since the rollers are separate entities, it is possible to place the laser lines in a zone located between two successive rollers.

When both sides of the substrate are to be treated, it is possible to employ a number of laser lines located on either side of the substrate, whether the latter is in a horizontal, vertical or any inclined position. These laser lines may be identical or different, in particular their wavelengths may be different, especially adapted to each of the coatings to be treated.

The laser device according to the invention may be integrated into a layer deposition line, for example a magnetron sputtering deposition line or a chemical vapor deposition (CVD) line, especially a plasma-enhanced (PECVD) line, under vacuum or at atmospheric pressure (AP-PECVD). In general, the line includes substrate handling devices, a deposition unit, optical control devices and stacking devices. For example, the substrates run on conveyor rollers, in succession past each device or each unit.

The laser device is preferably located just after the coating deposition unit, for example at the exit of the deposition unit. The coated substrate may thus be treated in line after the coating has been deposited, at the exit of the deposition unit and before the optical control devices, or after the optical control devices and before the substrate stacking devices.

The laser device may also, in certain cases, be integrated into the deposition unit. For example, laser sources may be introduced into one of the chambers of a sputtering deposition unit, especially in a chamber in which the atmosphere is rarefied, especially at a pressure between $10^{-6}$ mbar and $10^{-2}$ mbar. The laser device may also be placed outside the deposition unit, but so as to treat a substrate located inside said unit. It is possible for example, in the case of the use of a laser, to provide for this purpose a window transparent to the wavelength of the radiation used, through which the laser radiation would pass to treat the layer.

Whether the laser device is outside the deposition unit or integrated thereinto, these "in-line" processes are preferable to a process involving off-line operations, in which it would be necessary to stack the glass substrates between the deposition step and the laser treatment.

However, processes involving off-line operations may have an advantage in cases in which the laser treatment is carried out in a place different from that where the deposition is carried out, for example in a place where conversion of the glass takes place. The laser device may therefore be integrated into lines other than the layer deposition line. For example, it may be integrated into a multiple glazing (especially double or triple glazing) manufacturing line, into a laminated glazing manufacturing line, or else into a curved and/or dip-coated glazing manufacturing line. Laminated or curved or dip-coated glazing may be used both as building glazing or motor vehicle glazing. In these various cases, the laser treatment is preferably carried out before the multiple glazing or laminated glazing is produced. The laser treatment may however be carried out after the double glazing or laminated glazing is produced.

The laser device is preferably positioned in a closed chamber that makes it possible to protect people by preventing any contact with the laser radiation and to prevent any pollution, in particular of the substrate, optics, or treatment zone.

The coating may be deposited on the substrate by any type of process, in particular processes generating predominantly amorphous or nanocrystalline layers, such as the sputtering, especially magnetron sputtering, process, the plasma-enhanced chemical vapor deposition (PECVD) process, the vacuum evaporation process or the sol-gel process.

Preferably, the coating is deposited by sputtering, especially magnetron sputtering.

The substrate is preferably made of glass, of glass-ceramic or of a polymeric organic material. It is preferably transparent, colorless (it is then a clear or extra-clear glass) or colored, for example blue, gray, green or bronze. The glass is preferably of soda-lime-silica type, but it may also be glass of borosilicate or alumino-borosilicate type. The preferred polymeric organic materials are polycarbonate, polymethyl methacrylate, polyethylene terephthalate (PET), polyethylene naphthalate (PEN), or else fluoropolymers such as ethylene tetrafluoroethylene (ETFE).

The substrate advantageously has at least one dimension of at least 1 m, in particular 2 m, and even 3 m. The thickness of the substrate generally varies between 0.1 mm and 19 mm, preferably between 0.7 and 9 mm, in particular between 2 and 8 mm, or between 4 and 6 mm. The substrate may be flat or curved, or even flexible.

The glass substrate is preferably of float glass type, that is to say capable of having been obtained by a process that consists in pouring the molten glass onto a bath of molten tin ("float" bath). In this case, the coating to be treated may equally be deposited on the "tin" side as on the "atmosphere" side of the substrate. The terms "atmosphere" and "tin" sides are understood to mean the sides of the substrate that have respectively been in contact with the atmosphere prevailing in the float bath and in contact with the molten tin. The tin side contains a small superficial amount of tin that has diffused into the structure of the glass. The glass substrate may also be obtained by rolling between two rolls, a technique that makes it possible in particular to imprint patterns onto the surface of the glass.

Another subject of the invention is the use of a material according to the invention as a reflective polarizer or as an optical filter.

The expression "reflective polarizer" is understood to mean a polarizer capable of reflecting one polarization and of transmitting the other. In particular it is the materials whose geometric patterns are lines that will form the best reflective polarizers. In this case, the radiations that will be polarized will be those whose wavelength is of the order of the period of the lines. Depending on the period obtained, it is therefore possible to polarize infrared or visible radiations.

Reflective polarisers can in particular be used in liquid crystal display devices (in particular LCD screens) or else switchable mirrors. Switchable mirrors may in particular be obtained using two superimposed reflective polarizers. Such reflective polarizers may also be used in the building field, in order to be able to control, on demand, the level of transmission or reflection of glazing.

Optical filters may find various applications, also in the field of display screens, or else in the building field, as glazing that makes it possible to filter out a portion of the solar energy. The periodicity of the patterns makes the filter particularly effective.

Another subject of the invention is the use of a material according to the invention as an electrode, in particular for solar cells. The advantage of the material according to the invention in applications of this type lies in its high optical transmission, the metallic layer not covering the whole of the surface of the substrate.

The materials according to the invention may also be used in single, multiple or laminated glazing, mirrors, and glass wall coverings. In the case of multiple glazing comprising at least two glass sheets separated by a gas-filled cavity, it is preferable for the multilayer stack to be placed on the face in contact with said gas-filled cavity, especially on face 2 relative to the outside (i.e. on the face of the substrate in contact with the outside of the building which is on the opposite side to the face turned toward the outside) or on face 3 (i.e. on that face of the second substrate starting from the outside of the building turned toward the outside).

The invention is illustrated with the aid of the following nonlimiting figures and exemplary embodiments.

The following multilayer stack was deposited in a known manner by magnetron sputtering onto a 4 mm thick clear glass substrate:

Glass/$Si_3N_4$ (26)/$TiO_2$ (7)/ZnO (6)/Ag (11)/$TiO_x$ (1)/ZnO (6)/$Si_3N_4$ (35)/$TiO_2$ (2).

The numbers between parentheses correspond to the physical thicknesses, expressed in nanometers. All the layers are continuous.

The formulae given do not predict the exact stoichiometry of the compounds forming the layers, or a possible doping. In this case, the layers of silicon nitride (referred to as "$Si_3N_4$") also contain aluminum because the target used contains it.

The coated substrate then runs under a laser line positioned perpendicular to the run direction in order to treat the coating and dewet the silver. The line is formed using high-power laser diodes. The linear power density of the laser is 490 W/cm.

The width of the laser line is around 48 micrometers. The wavelengths used are 913 and 980 nm.

When the run speed is too high (above 13 meters per minute), the silver layer remains continuous.

Figure 1:
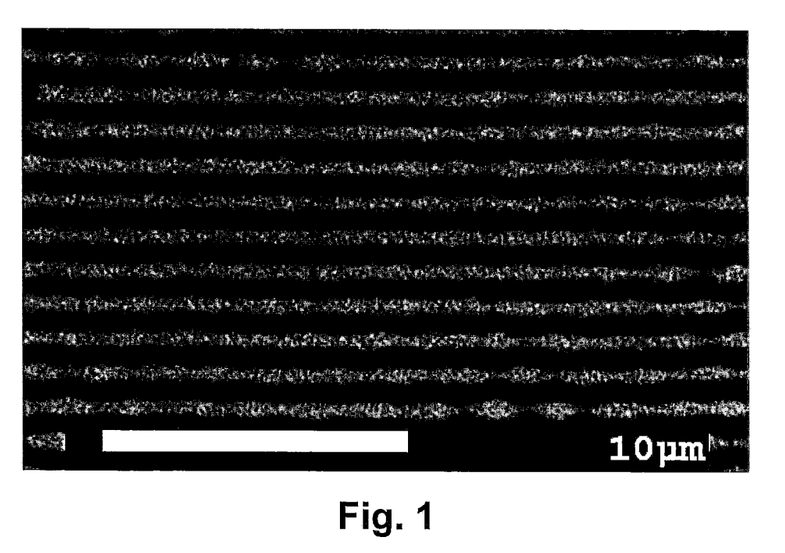
FIGS. 1 and 2 are scanning electron microscopy images of materials according to the invention.

By decreasing the run speed (below 13 meters per minute, in particular around 11.5 to 12.5 meters per minute), the silver layer begins to be dewetted and forms lines. FIG. 1 illustrates this embodiment. On the scanning electron microscopy image, the light lines correspond to the silver layer, which has become discontinuous and in the form of lines, extending in the run direction of the substrate, perpendicular to the laser line. The lines have a width of around 1 μm, and are regularly distributed, the period being of the order of 2 μm, therefore the order of double the wavelength of the laser.

Figure 2:
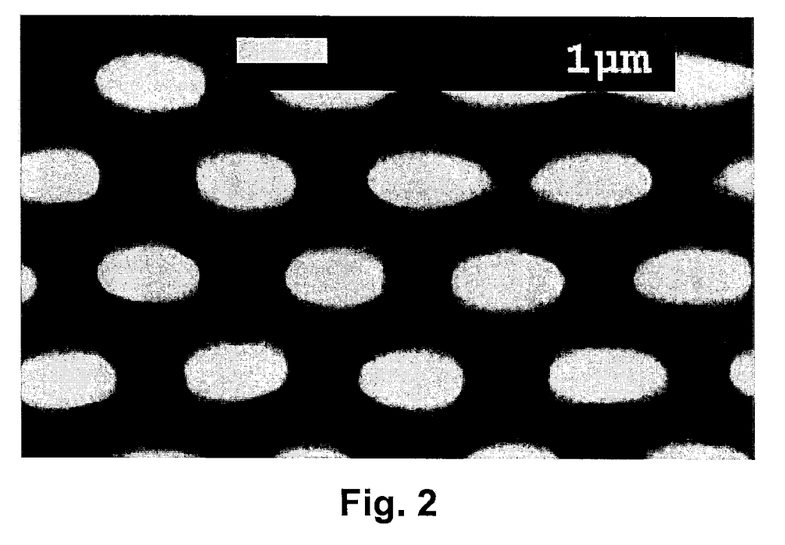

When the run speed is further reduced (to 11 meters per minute and below), the silver lines begin to be dewetted, until drops are formed. FIG. 2 illustrates this embodiment. The drops have a substantially identical shape, similar to an ellipse, and are distributed periodically. The major axis of the ellipse has a size of around 1 μm. The periodic patterns (drops) have a periodicity along several axes that are not parallel to one another. Each of these drops is the center of a hexagon, the vertices of which are the six drops closest to the drop in question.

For an even lower run speed, an ablation of the coating, and even of the surface layers of the glass, is observed.

The polarization properties of the material comprising lines as periodic patterns, represented in FIG. 1, were tested in the following manner. Using a spectrophotometer, the transmission spectrum and reflection spectrum were measured for each polarization (s and p). The absorption spectrum was calculated from these two spectra.

Figure 3A:
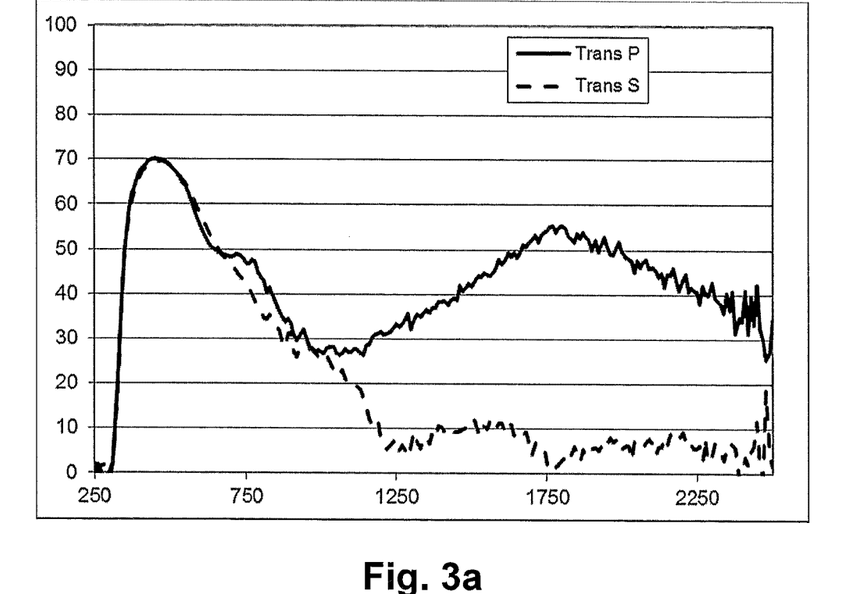
FIGS. 3a and 3b are transmission and absorption spectra of materials according to the invention.
Figure 3B:
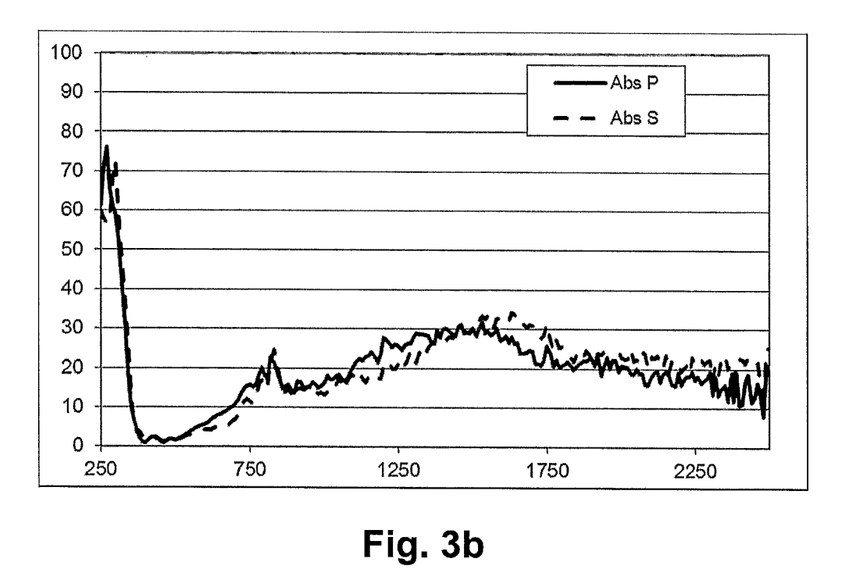

FIGS. 3a and 3b respectively represent the transmission spectrum and the absorption spectrum. As is customary, the wavelength (expressed in nm) is plotted on the x-axis and the transmission or absorption value (expressed in percent) is plotted on the y-axis.

The transmission spectrum shows that, for a wavelength of around 1800 nm and for one polarization (in this case the polarization p, taking into account the orientation of the material) is transmitted while the other (here the polarization s) is transmitted very little. The absorption spectrum shows that the absorption does not depend on the polarization: the polarization s is therefore reflected.

The invention claimed is:

1. A process for obtaining a material comprising a substrate coated on at least one portion of at least one of its faces with a coating comprising at least one discontinuous metallic thin layer based on silver, on gold, or on any alloy thereof, the or each discontinuous metallic thin layer being encapsulated between at least two dielectric thin layers, and the or each discontinuous metallic thin layer being in the form of periodic geometric patterns, said process comprising:

depositing a coating on at least one portion of at least one face of said substrate, the coating comprising at least one continuous metallic thin layer based on silver, on gold, or on any alloy thereof, the or each continuous metallic thin layer being encapsulated between at least two dielectric thin layers, then making the substrate thus coated run opposite at least one laser device emitting a laser radiation focused on said coating in the form of at least one line, a power of said radiation being adapted in order to render the or each metallic thin layer discontinuous by dewetting.

2. The process as claimed in claim 1, wherein the periodic geometric patterns have a period within a range extending from 0.1 to 10 micrometers.

3. The process as claimed in claim 1, wherein the geometric patterns obtained are lines extending in the run direction of the substrate.

4. The process as claimed in claim 1, wherein the periodic patterns have a periodicity along at least two axes that are not parallel to one another.

5. The process as claimed in claim 1, wherein a physical thickness of the or each continuous metallic thin layer is within a range extending from 2 to 20 nm.

6. The process as claimed in claim 1, wherein a wavelength of the laser radiation is within a range extending from 200 to 2000 nm.

7. The process as claimed in claim 1, wherein the laser radiation is continuous.

8. The process as claimed in claim 1, wherein the substrate is made of glass, of glass-ceramic or of a polymeric organic material.

9. The process as claimed claim 1, wherein the coating comprises, starting from the substrate, a first coating comprising at least a first dielectric layer, at least a metallic thin layer, optionally an overblocker layer and a second coating comprising at least a second dielectric layer.

10. The process as claimed in claim 9, wherein the first and/or second dielectric layer is an oxide, or a nitride.

11. The process as claimed in claim 1, wherein the substrate has at least one dimension of at least 1 m.

12. The process as claimed in claim 1, wherein the coating is deposited by sputtering.

13. The process as claimed in claim 2, wherein the period is within a range extending from 0.3 to 5 micrometers.

14. The process as claimed in claim 6, wherein the wavelength of the laser radiation is within a range extending from 500 to 1500 nm.

15. The process as claimed in claim 10, wherein the oxide is tin oxide or titanium oxide, and the nitride is silicon nitride.

16. The process as claimed in claim 11, wherein the at least one dimension is at least 2 m.

17. The process as claimed in claim 16, wherein the at least one dimension is at least 3 m.

* * * * *